(12) United States Patent
Wu et al.

(10) Patent No.: US 11,004,799 B2
(45) Date of Patent: *May 11, 2021

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Kai-Chiang Wu, Hsinchu (TW); Chen-Hua Yu, Hsinchu (TW); Kuo-Chung Yee, Taoyuan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/891,076

(22) Filed: Jun. 3, 2020

(65) Prior Publication Data

US 2020/0294926 A1    Sep. 17, 2020

Related U.S. Application Data

(63) Continuation of application No. 16/578,403, filed on Sep. 23, 2019, now Pat. No. 10,707,173, which is a (Continued)

(51) Int. Cl.
*H01L 23/538* (2006.01)
*H01L 23/66* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC ............. H01L 23/5389; H01L 21/4857; H01L 23/5384; H01L 23/5386; H01L 24/19;
(Continued)

(56) References Cited

U.S. PATENT DOCUMENTS 9,000,584 B2   4/2015  Lin et al.
9,048,222 B2   6/2015  Hung et al.
(Continued)

OTHER PUBLICATIONS

"Office Action of Taiwan Counterpart Application", dated Oct. 29, 2020, p. 1-p. 4.

*Primary Examiner* — Caleen O Sullivan
(74) *Attorney, Agent, or Firm* — JCIPRNET

(57) ABSTRACT

A package structure and the method thereof are provided. The package structure includes a conductive plate, a semiconductor die, a molding compound, and antenna elements. The conductive plate has a first surface, a second surface and a sidewall connecting the first surface and the second surface. The semiconductor die is located on the second surface of the conductive plate. The molding compound laterally encapsulates the semiconductor die and covers the sidewall and a portion of the second surface exposed by the semiconductor die, wherein the first surface of the conductive plate is coplanar with a surface of the molding compound. The antenna elements are located over the first surface of the conductive plate.

20 Claims, 11 Drawing Sheets

Related U.S. Application Data continuation of application No. 15/696,192, filed on Sep. 6, 2017, now Pat. No. 10,461,034.

(60) Provisional application No. 62/537,442, filed on Jul. 26, 2017.

(51) Int. Cl.

| | |
|---|---|
| *H01L 23/367* | (2006.01) |
| *H01L 23/31* | (2006.01) |
| *H01L 21/48* | (2006.01) |
| *H01L 21/56* | (2006.01) |
| *H01L 23/00* | (2006.01) |
| *H01Q 1/22* | (2006.01) |
| *H01L 23/498* | (2006.01) |
| *H01L 21/683* | (2006.01) |
| *H01Q 1/24* | (2006.01) |

(52) U.S. Cl.
CPC ...... *H01L 21/4857* (2013.01); *H01L 21/4875* (2013.01); *H01L 21/4889* (2013.01); *H01L 21/561* (2013.01); *H01L 21/565* (2013.01); *H01L 21/6835* (2013.01); *H01L 23/3114* (2013.01); *H01L 23/3135* (2013.01); *H01L 23/3675* (2013.01); *H01L 23/49833* (2013.01); *H01L 23/49838* (2013.01); *H01L 23/5383* (2013.01); *H01L 23/5384* (2013.01); *H01L 23/5386* (2013.01); *H01L 23/66* (2013.01); *H01L 24/19* (2013.01); *H01L 24/20* (2013.01); *H01Q 1/2283* (2013.01); *H01L 23/3128* (2013.01); *H01L 23/49822* (2013.01); *H01L 23/49827* (2013.01); *H01L 24/29* (2013.01); *H01L 24/32* (2013.01); *H01L 24/73* (2013.01); *H01L 24/92* (2013.01); *H01L 2221/68345* (2013.01); *H01L 2221/68359* (2013.01); *H01L 2223/6677* (2013.01); *H01L 2224/04105* (2013.01); *H01L 2224/12105* (2013.01); *H01L 2224/19* (2013.01); *H01L 2224/214* (2013.01); *H01L 2224/2919* (2013.01); *H01L 2224/32225* (2013.01); *H01L 2224/73267* (2013.01); *H01L 2224/92244* (2013.01); *H01L 2924/141* (2013.01); *H01L 2924/143* (2013.01); *H01L 2924/1421* (2013.01); *H01L 2924/1431* (2013.01); *H01L 2924/1434* (2013.01); *H01Q 1/243* (2013.01)

(58) Field of Classification Search
CPC ... H01L 24/20; H01L 21/4889; H01L 21/565; H01L 21/486; H01L 23/5383; H01L 21/4853; H01L 21/4875; H01L 23/3114; H01L 23/3675; H01L 23/66; H01L 2223/6677; H01L 2224/214; H01L 2224/19; H01Q 1/2283; H01Q 1/243
USPC .......................................................... 257/428
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,461,034 B2 * | 10/2019 | Wu .................. H01L 21/4853 |
| 10,707,173 B2 * | 7/2020 | Wu ..................... H01L 21/486 |
| 2016/0218072 A1 | 7/2016 | Liao et al. |
| 2017/0186726 A1 | 6/2017 | Tang et al. |

* cited by examiner

PACKAGE STRUCTURE AND MANUFACTURING METHOD THEREOF

CROSS-REFERENCE TO RELATED APPLICATION

This application is a continuation application of and claims the priority benefit of a prior application Ser. No. 16/578,403, filed on Sep. 23, 2019. The prior application Ser. No. 16/578,403 is a continuation application of and claims the priority benefit of a prior application Ser. No. 15/696,192, filed on Sep. 6, 2017, which claims the priority benefit of U.S. provisional application Ser. No. 62/537,442, filed on Jul. 26, 2017. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
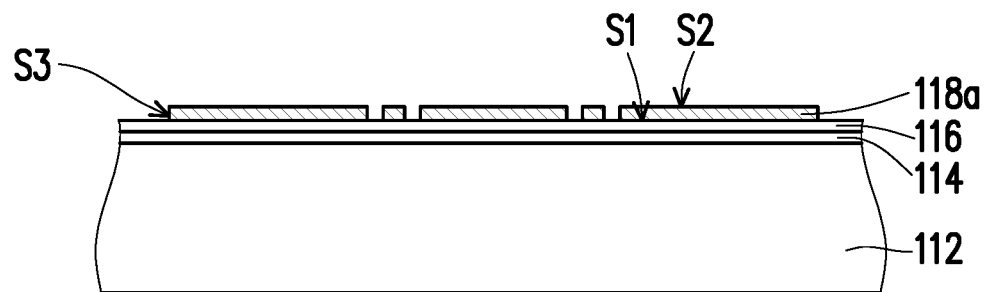
FIG. 1 to FIG. 10 are schematic cross sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 are schematic cross sectional views of various stages in a manufacturing method of a package structure according to some exemplary embodiments of the present disclosure. FIG. 11 is a schematic top view illustrating a relative position between a conductive plate, a die attach film, and antenna elements of a package structure according to some exemplary embodiments of the present disclosure. FIG. 1 to FIG. 10 are the schematic cross sectional views taken along a section line A-A' depicted in FIG. 11. FIG. 12A to FIG. 12G are schematic top views illustrating various predetermined patterns of a conductive plate corresponding to the antenna elements according to some exemplary embodiments of the present disclosure. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 10, one die is shown to represent plural dies of the wafer, and a package structure 10 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 1, in some embodiments, a carrier 112 is provided. The carrier 112 may be a glass carrier or any suitable carrier for the manufacturing method of the package structure. In some embodiments, the carrier 112 is provided with a conductive plate 118a, a debond layer 114 and a buffer layer 116 formed thereon, where the conductive plate 118a has a first surface S1, a second surface S2 opposite to the first surface S1, and a sidewall S3 connecting the first surface S1 and the second surface S2. As shown in FIG. 1, the buffer layer 116 is located between the debond layer 114 and the first surface S1 of the conductive plate 118a, and the debond layer 114 is located between the carrier 112 and the buffer layer 116, where a portion of the buffer layer 116 is exposed by the conductive plate 118a. In one embodiment, the conductive plate 118a is a single-layer structure.

The material of the debond layer 114 may be any material suitable for debonding the carrier 112 from the above layers disposed thereon. In some embodiments, for example, debond layer 114 may include a release layer (such as a light-to-heat conversion ("LTHC") layer) and an adhesive layer (such as an ultra-violet curable adhesive or a heat curable adhesive layer). In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The debond layer 114 and the buffer layer 116 may be formed by a suitable fabrication technique such as spin-coating, lamination, deposition, or the like. The material of the conductive plate 118a may, for example, include may include aluminum, titanium, copper, nickel, tungsten, and/or alloys thereof. In one embodiment, the conductive plate 118a may be formed by a suitable fabrication technique such as plating process, photolithography and etching processes, or the like. In some embodiments, the patterning process includes performing a dry etching process, a wet etching process, or a combination thereof.

Figure 12A:
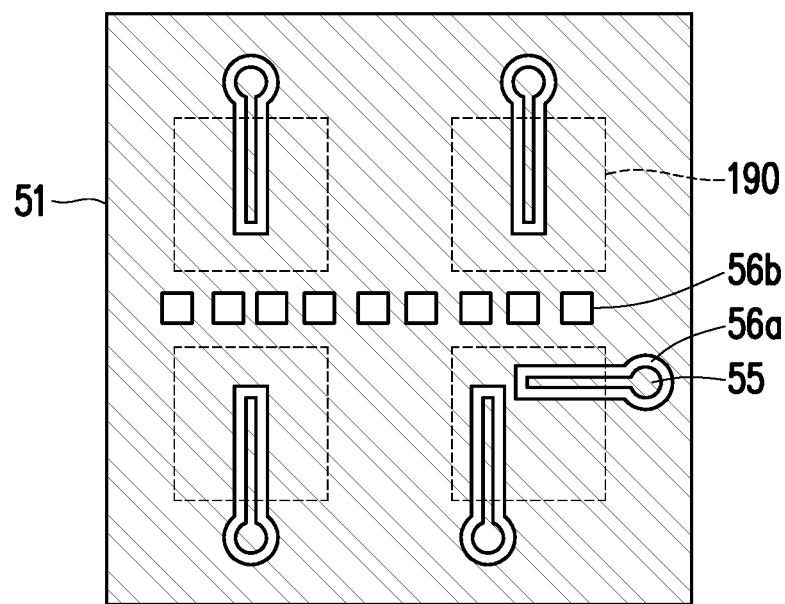
FIG. 12A to FIG. 12G are schematic top views illustrating various predetermined patterns of a conductive plate corresponding to the antenna elements according to some exemplary embodiments of the present disclosure.
Figure 12B:
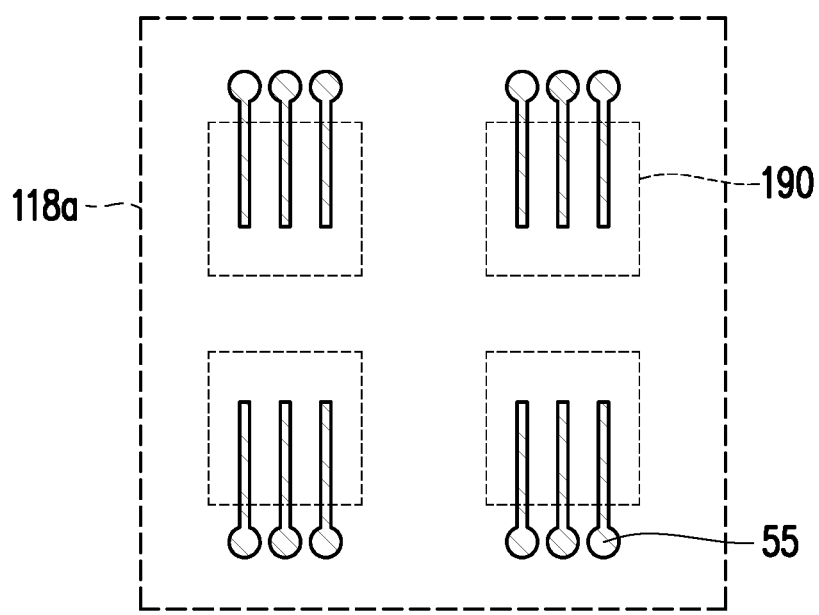
Figure 12C:
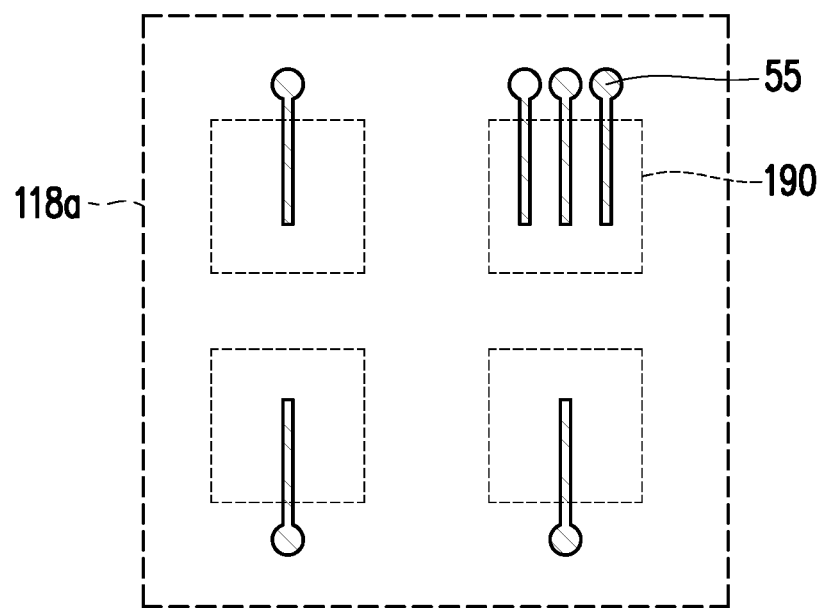
Figure 12D:
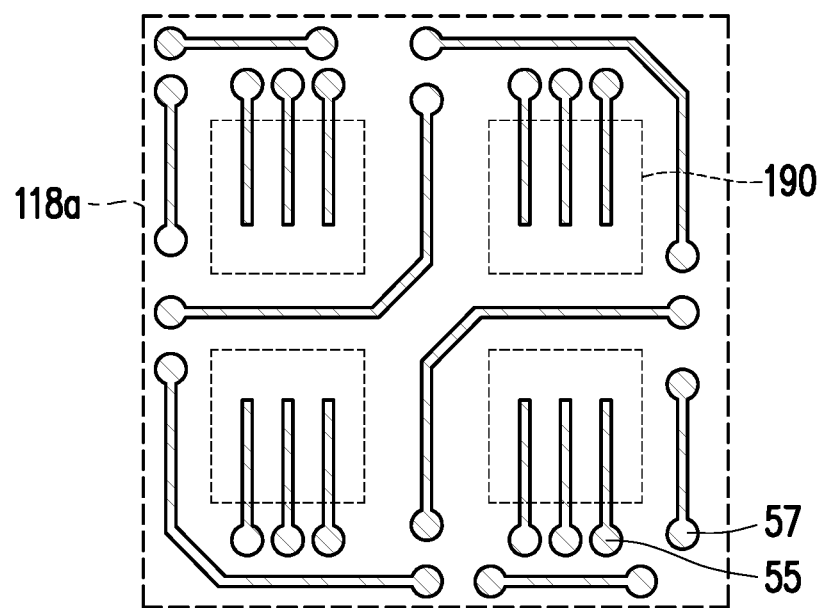

In some embodiment, as shown in FIG. 1, the conductive plate 118a is patterned to a predetermined target pattern including a solid metal plate 51, metal lines 55 and openings 56a, 56b. For example, in FIG. 12A, the location of the metal lines 55 correspondingly overlap with the locations of the later-formed antenna elements 190 and are electrically isolated (separated) from the solid metal plate 51 through the openings 56a. In FIG. 12A to FIG. 12G, the locations of the later-formed antenna elements 190 are illustrated as four rectangular blocks encircled by the dot lines. However, the number or the shape of the antenna elements are not limited by the examples herein. As shown in FIG. 12A, the metal lines 55 may serve as feed lines for the later-formed antenna elements 190 while the solid metal plate 51 may serve as a ground plate for the later-formed antenna elements 190, and the openings 56b are optionally formed in the conductive plate 118a for fitting the pattern density control of the design rule.

In some embodiment, the conductive plate 118a may be patterned to a predetermined target pattern including metal lines. For example, in FIG. 12B and in FIG. 12C, the location of the metal lines 55 correspondingly overlap with the locations of the later-formed antenna elements 190, so that a portion of the metal lines 55 may serve as feed lines for the later-formed antenna elements 190, and another portion of the metal lines 55 may serve as a ground plate for the later-formed antenna elements 190. In one embodiment, the numbers of the metal lines 55 correspondingly overlapped with different later-formed antenna elements 190 can be the same (see FIG. 12B). For an alternative embodiment, the numbers of the metal lines 55 correspondingly overlapped with different later-formed antenna elements 190 can be different (see FIG. 12C).

In some embodiment, the conductive plate 118a may be patterned to a predetermined target pattern including metal lines 55 and metal lines 57. For example, in FIG. 12B and in FIG. 12C, the location of the metal lines 55 correspondingly overlap with the locations of the later-formed antenna elements 190, so that a portion of the metal lines 55 may serve as feed lines for the later-formed antenna elements 190, and another portion of the metal lines 55 may optionally serve as a ground plate for the later-formed antenna elements 190. On the other hand, the metal lines 57 without overlapping the later-formed antenna elements 190 may serve as routing lines for other later-formed elements.

Figure 12E:
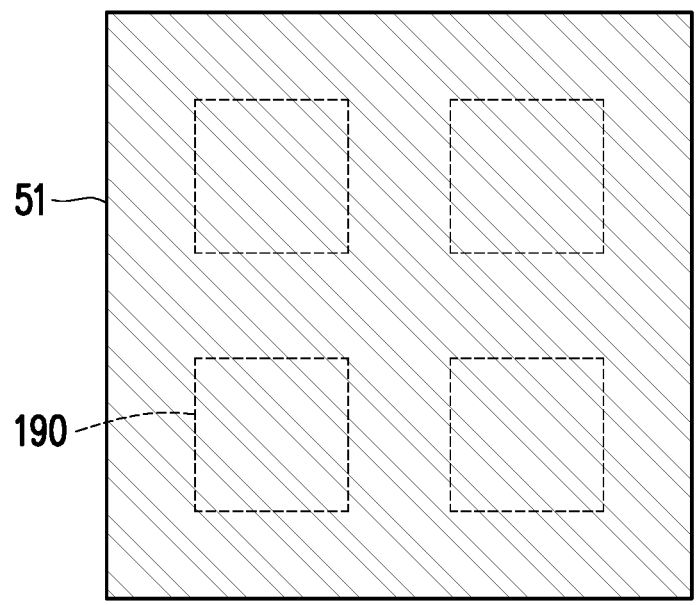
Figure 12F:
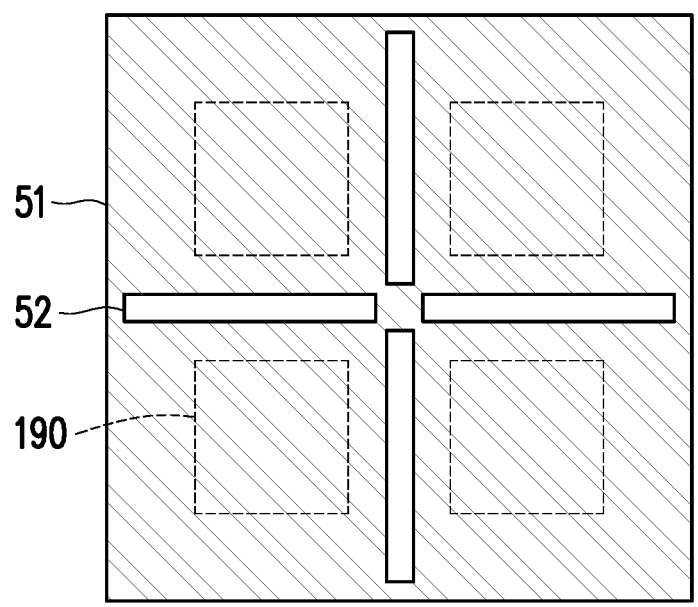

In some embodiment, the conductive plate 118a may be patterned to have a predetermined target pattern including a solid metal plate 51 (as shown in FIG. 12E), where the solid metal plate 51 overlaps with the later-formed antenna elements 190. In some embodiment, the conductive plate 118a may be patterned to have a predetermined target pattern in a form of a solid metal plate 51 having slits 52 arranged in a cross-form (as shown in FIG. 12F), where the solid metal plate 51 overlaps with the later-formed antenna elements 190, and the later-formed antenna elements 190 are separated by the slits 52.

Figure 12G:
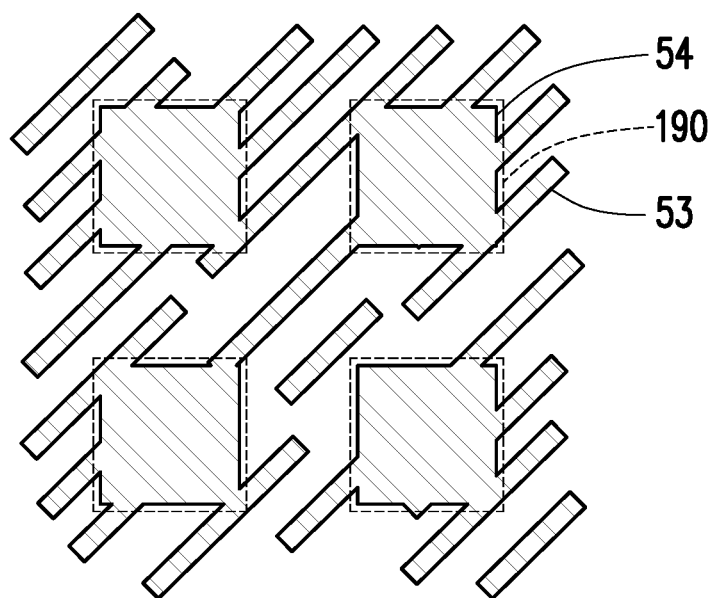

In some embodiment, the conductive plate 118a may be patterned to have a predetermined target pattern including a plurality of metal blocks 54 being interconnected with a plurality of metal strips 53 (as shown in FIG. 12G), where at least a portion of each of the metal blocks 54 overlaps with the later-formed antenna elements 190. In one embodiment, the area of each the metal blocks 54 is greater than the area of the later-formed antenna elements 190. In one embodiment, the area of each the metal blocks 54 is less than the area of the later-formed antenna elements 190. In one embodiment, the area of each the metal blocks 54 is substantially equal to the area of the later-formed antenna elements 190. In an alternative embodiment, the area of a portion the metal blocks 54 is greater than the area of the later-formed antenna elements 190, the area of another portion the metal blocks 54 is less than the area of the later-formed antenna elements 190, and/or the area of another portion the metal blocks 54 is substantially equal to the area of the later-formed antenna elements 190.

Due to the considerations of density control, performance efficacy, and/or routing purpose, the predetermined target pattern of the conductive plate 118a can be designated and selected based on the demand. In the disclosure, the numbers of the slits 52, the metal strips 53, the metal blocks 54, the metal lines 55, the openings 56b, and the metal lines 57 is not limited. In some embodiments, the number of the metal lines 55 correspondingly overlapped with the later-formed antenna elements 190 can be one or more than one. In certain embodiments, the conductive plate 118a may be a copper plate; however, the disclosure is not specifically limited thereto.

Figure 2:
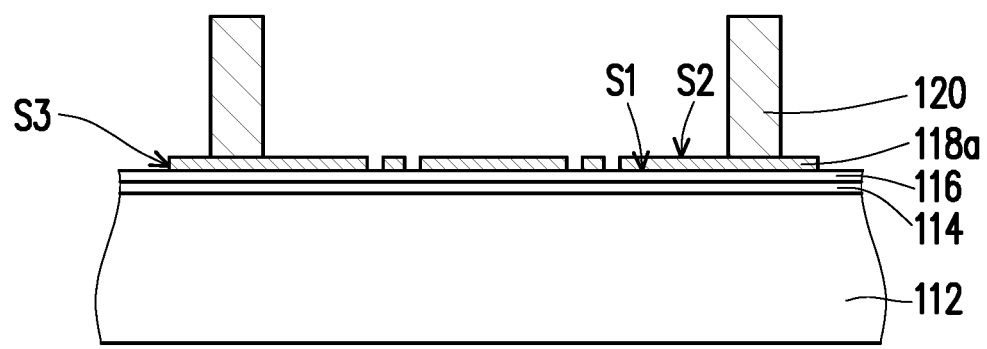

Next, through interlayer vias (TIVs) 120 are formed on the carrier 112. In certain embodiments, at least one of the TIVs 120 are directly disposed on the conductive plate 118a as shown in FIG. 2, and the rest of TIVs 120 are directly disposed on the buffer layer 116 (not shown in FIG. 2). In other words, as shown in FIG. 2, at least one of the TIVs 120 are physically connected to the second surface S2 of the conductive plate 118a. however, the disclosure is not limited thereto. In some embodiments, the TIVs 120 are directly disposed on the buffer layer 116.

In some embodiments, the TIVs 120 are through integrated fan-out (InFO) vias. In certain embodiments, the TIVs 120 are arranged along but not on a cutting line (not shown) between two package structures 10. In some embodiments, the TIVs 120 are formed by photolithography, plating, photoresist stripping processes or any other suitable method. In one embodiment, the TIVs 120 may be formed by forming a mask pattern (not shown) covering the conductive plate 118a and the buffer layer 116 with openings exposing a portion the conductive plate 118a, forming a metallic material filling the openings to form the TIVs 120 by electroplating or deposition and then removing the mask pattern. However, the disclosure is not limited thereto. In one embodiment, the material of the TIVs 120 may include a metal material such as copper or copper alloys, or the like. In some embodiments, the thickness of the conductive plate 118a may be less than 10 μm. For simplification, only two TIVs 120 are presented in FIG. 2 for illustrative purposes, however, it should be noted that more than two TIVs may be formed; the disclosure is not limited thereto. The number of the TIVs can be selected based on the demand.

Figure 3:
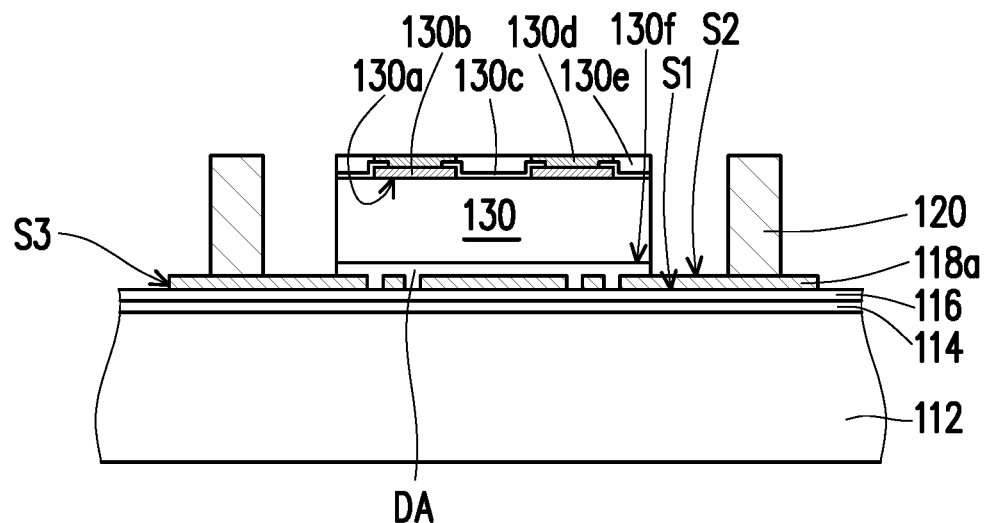

Referring to FIG. 3, in some embodiments, at least one die 130 with a connecting film DA disposed thereon is provided, where the die 130 has an active surface 130a and a backside surface 130f opposite to the active surface 130a. As shown in FIG. 3, the die 130 is disposed on the conductive plate 118a and over the carrier 112 through the connecting film DA. In some embodiments, the connecting film DA is located between the die 130 and the conductive plate 118a, and the connecting film DA physically contacts the backside surface 130f of the die 130 and the second surface S2 of the conductive plate 118a. As shown in FIG. 3, bottom surfaces of TIVs 120 disposed on the conductive plate 118a are coplanar with at least a portion of a side of the connecting film DA at the second surface S2 of the conductive plate 118a. In some embodiments, due to the connecting film DA provided between the die 130 and the conductive plate 118a, the die 130 and the conductive layer 118a are stably adhered to each other. In some embodiments, the connecting film DA may be, for example, a die attach film, a layer made of adhesives or epoxy resin, or the like that are made of thermally conductive and electrically conductive materials or thermally conductive and electrically isolated materials, for example. Owing to the connecting film DA, the conductive plate 118a and the die 130 are thermally coupled, such that the heat generated by the die 130 may be dissipated through the conductive plate 118a. As shown in FIG. 3, for example, an area of the conductive plate 118a is greater than an area of the die 130, but the disclosure is not limited thereto. In an alternative embodiment, the area of the conductive plate 118a may be smaller than the area of the die 130. In a further alternative embodiment, the area of the conductive plate 118a may be equal to the area of the die 130.

In some embodiments, as shown in FIG. 3, the die 130 includes the active surface 130a, a plurality of pads 130b distributed on the active surface 130a, a passivation layer 130c covering the active surface 130a and a portion of the pad 130b, a plurality of conductive pillars 130d, a protection layer 130e, and the backside surface 130f opposite to the active surface 130a. The pads 130b are partially exposed by the passivation layer 130c, the conductive pillars 130d are disposed on and electrically connected to the pads 130b, and the protection layer 130e covers the passivation layer 130c and exposes the conductive pillars 130d. The conductive pillars 130d are copper pillars, copper alloy pillar or other suitable metal pillars, for example. In some embodiments, the passivation layer 130c and the protection layer 130e may be a polybenzoxazole (PBO) layer, a polyimide (PI) layer or other suitable polymers. In some alternative embodiments, the passivation layer 130c and the protection layer 130e may be made of inorganic materials, such as silicon oxide, silicon nitride, silicon oxynitride, or any suitable dielectric material.

The material of the passivation layer 130c can be the same or different from the material of the protection layer 130e, for example. In an alternative embodiment, the die 130 may include the pads 130b distributed on the active surface 130a, the passivation layer 130c covering the active surface 130a and a portion of the pad 130b, the backside surface 130f opposite to the active surface 130a. As shown in FIG. 3, only one die is presented for illustrative purposes, however, it should be noted that one or more dies may be provided. In some embodiments, the die 130 described herein may be referred as a chip or an integrated circuit (IC). In some embodiments, the die 130 includes at least one wireless and radio frequency (RF) chip. In some embodiments, the die 130 may further include additional chip(s) of the same type or different types. For example, in an alternative embodiment, more than one die 130 are provided, and the dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the die 130 may be referred as a chip or an IC of combination-type, and the die 130 may be a WiFi chip simultaneously including both of a RF chip and a digital chip.

Figure 4:
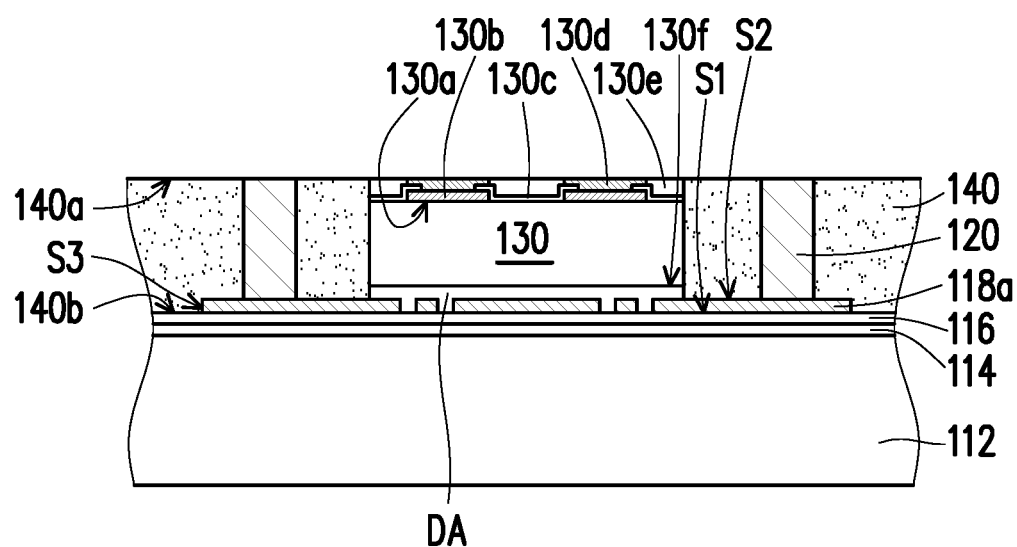

Referring to FIG. 4, in some embodiments, the conductive plate 118a, the connecting film DA, the TIVs 120 and the die 130 are molded in a molding compound 140. In some embodiments, the molding compound 140 is formed on the buffer layer 116 and the conductive plate 118a, and over the carrier 112. As shown in FIG. 4, the molding compound 140 at least fills up the gaps between the TIVs 120 and between the TIVs 120, the die 130 and the connecting film DA. In some embodiments, the molding compound 140 covers the conductive plate 118a, the connecting film DA and the buffer layer 116. As shown in FIG. 4, the molding compound 140 covers the second surface S2 and the sidewall S3 of the conductive plate 118a, and the first surface S1 of the conductive plate 118a is exposed from the bottom surface 140b of the molding compound 140, where the first surface S1 of the conductive plate 118a and a portion of the bottom surface 140b of the molding compound 140 are leveled and coplanar with each other. The molding compound 140 wraps the sidewalls of the TIVs 120 and the die 130 and exposes top surfaces of the TIVs 120 and the die 130 (e.g. the conductive pillars 130d and the protection layer 130e of the die 130). In some embodiments, the top surfaces of the TIVs 120 and the die 130 exposed by a top surface 140a of the molding compound 140 become substantially leveled with the top surface 140a of the molding compound 140. In other words, the top surfaces 140a of the molding compound 140 and the top surfaces of the TIVs 120 and the die 130 are coplanar. In some embodiments, the material of the molding compound 140 has low permittivity (Dk) and low loss tangent (DO properties. Depending on the frequency range of the high-speed applications, suitable materials of the molding compound 140 may be selected based on the required electrical properties of the package structure. As shown in FIG. 4, the sidewall of the connecting film DA is covered by the molding compound 140. In some embodiments, different surfaces of the connecting film DA are respectively in contact with the backside surface of the at least one die, the molding compound, and the second surface S2 of the conductive plate 118a. As shown in FIG. 4, the connecting film DA physically contacts the molding compound 140, the conductive plate 118a, and the die 130. The conductive plate 118a physically contacts to the at least one of the TIVs 120, the buffer layer 116, the molding compound 140, and the connecting film DA. The molding compound 140 covers the second surface S2 and the sidewall S3 of the conductive plate 118*a*, and a portion of the bottom surface 140*b* of the molding compound 140 is coplanar and leveled with the first surface S1 of the conductive plate 118*a*. As shown in FIG. 4, the die 130, the molding compound 140 and the ground plate 118*a* are in contact with different surfaces of the connecting film DA, respectively.

In an alternative embodiment (not shown), the conductive plate 118*a*, the connecting film DA, the TIVs 120 and the die 130 may be over-molded by the molding compound 140. Then, the molding compound 140 is required to be planarized until the top surfaces of the TIVs 120 and the die 130 (e.g., the conductive pillars 130*d* and the protection layer 130*e* of the die 130) are exposed by the top surface 140*a* of the molding compound 140. In certain embodiments, after the planarization, the top surface 140*a* of the molding compound 140 and the top surfaces of the TIVs 120, the conductive pillars 130*d* and the protection layer 130*e* of the die 130 become substantially leveled and coplanar. In some embodiments, the planarizing step may include a grinding process, fly cutting process, or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method.

Figure 5:
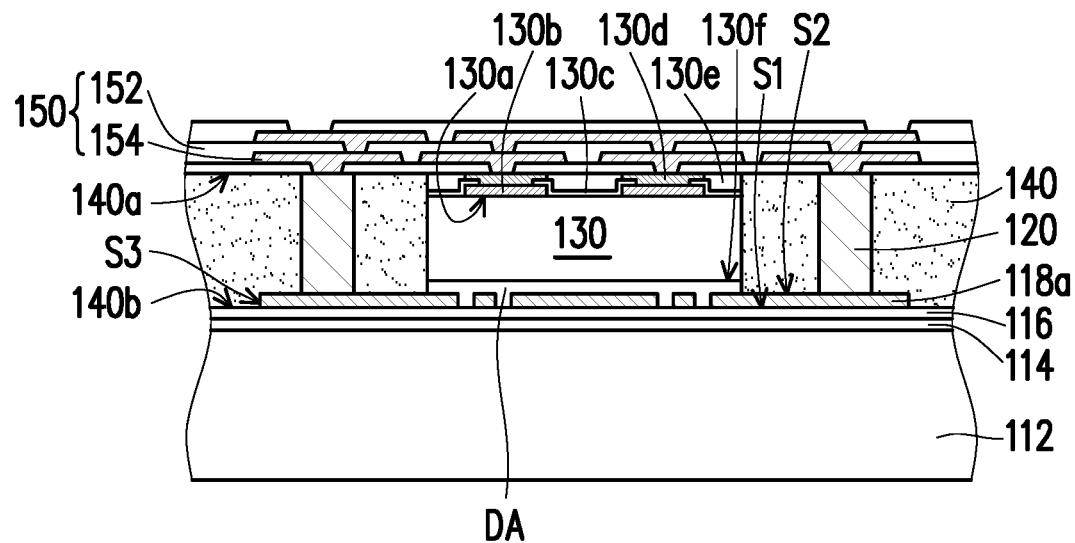

Referring to FIG. 5, in some embodiments, a redistribution layer 150 is formed on the TIVs 120, the die 130 and the molding compound 140. As shown in FIG. 5, the redistribution layer 150 is formed on the top surface 140*a* of the molding compound 140. In some embodiments, the redistribution layer 150 is electrically connected to the conductive plate 118*a* through the TIVs 120, and is electrically connected to the die 130 through the conductive pillars 130*d*. In some embodiments, the conductive plate 118*a* is electrically connected to the die 130 through the TIVs 120, the redistribution layer 150 and the conductive pillars 130*d*. In some embodiments, as shown in FIG. 5, the die 130 is directly located between the redistribution layer 150 and the connecting film DA, and the molding compound 140 is directly located between the redistribution layer 150 and the conductive plate 118 and between the redistribution layer 150 and the buffer layer.

In some embodiments, the formation of the redistribution layer 150 includes sequentially forming one or more polymer dielectric layers 152 and one or more metallization layers 154 in alternation. In certain embodiments, as shown in FIG. 5, the metallization layers 154 are sandwiched between the polymer dielectric layers 152, but the top surface of the topmost layer of the metallization layers 154 is exposed by the topmost layer of the polymer dielectric layers 152 and the lowest layer of the metallization layers 154 is exposed by the lowest layer of the polymer dielectric layers 152 to connect the TIVs 120 and the conductive pillars 130*d* of the die 130. In some embodiments, the material of the metallization layers 154 includes aluminum, titanium, copper, nickel, tungsten, and/or alloys thereof, and the metallization layers 154 may be formed by electroplating or deposition. In some embodiments, the material of the polymer dielectric layers 152 includes polyimide, epoxy resin, acrylic resin, phenol resin, benzocyclobutene (BCB), polybenzoxazole (PBO), or any other suitable polymer-based dielectric material. However, it should be noted that the redistribution layer 150 is not limited to include two dielectric layers and/or two metallization layers.

Figure 6:
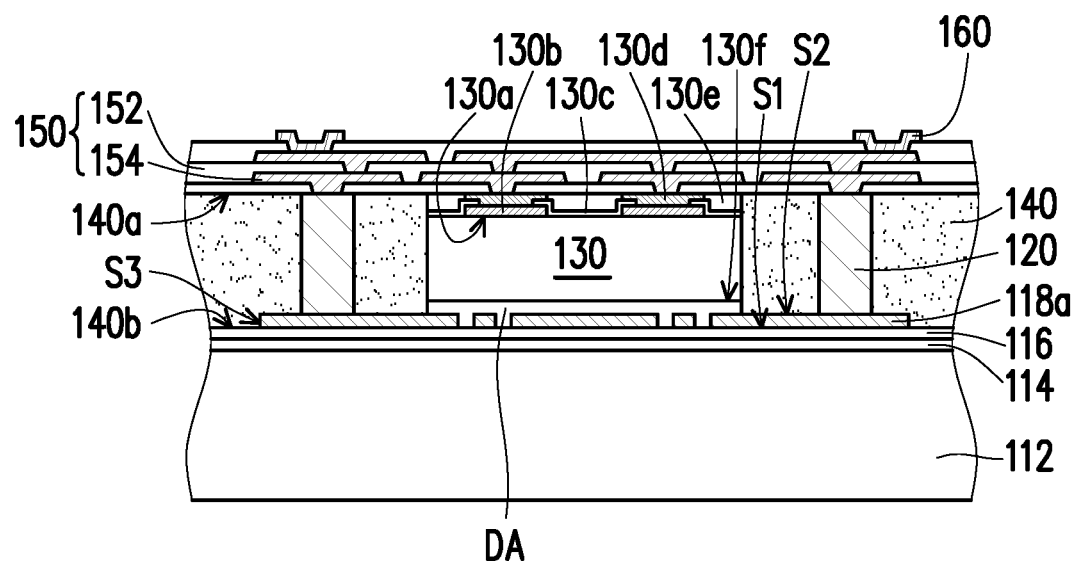

Referring to FIG. 6, in some embodiments, a plurality of under-ball metallurgy (UBM) patterns 160 is formed on the exposed top surface of the topmost layer of the metallization layers 154 of the redistribution structure 150 for electrically connecting with conductive elements (e.g. conductive balls) and/or semiconductor elements (e.g., passive components or active components). As shown in FIG. 6, for example, the redistribution layer 150 includes a front-side redistribution layer structure having the lowest layer of the metallization layers 154 physically and electrically connected to the TIVs 120 and the conductive pillars 130*d* of the die 130 and the exposed top surface of the topmost layer of the metallization layers 154 physically and electrically connected to the UBM patterns 160 for assisting ball mounting. In some embodiments, the material of the UBM patterns 160, for example, may include copper, nickel, titanium, tungsten, or alloys thereof or the like, and may be formed by an electroplating process, for example. As shown in FIG. 6, only two UBM patterns 160 are presented in FIG. 6 for illustrative purposes, however, it should be noted that more than two UBM patterns 160 may be formed; the disclosure is not limited thereto. Similarly, the number of the TIVs 120 can be selected based on the demand.

Figure 7:
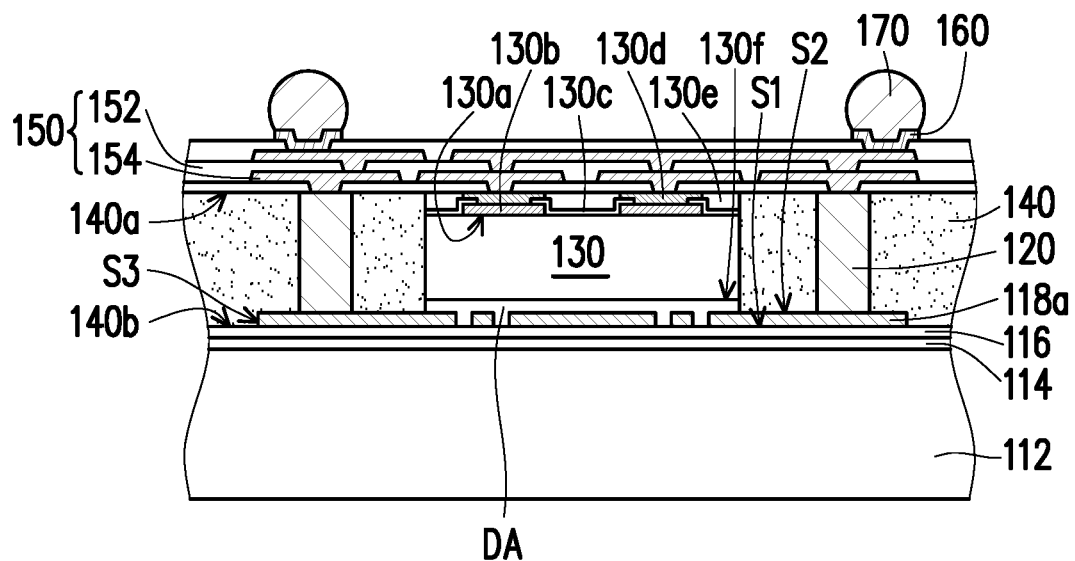

Referring to FIG. 7, in some embodiments, conductive elements 170 are formed on the redistribution layer 150. In one embodiment, the conductive elements 170 are formed on the redistribution layer 150 through the UBM patterns 160. In some embodiments, some of the conductive elements 170 are electrically connected to the die 130 through the UBM patterns 160 and the redistribution layer 150, and some of the conductive elements 170 are electrically connected to the conductive plate 118*a* through the UBM patterns 160, the redistribution layer 150, and the TIVs 120. In some embodiments, the conductive elements 170 are attached to the UBM patterns 160 through a solder flux. In some embodiments, the conductive elements 170 are, for example, solder balls or ball grid array (BGA) balls. In some embodiments, the conductive elements 170 may be disposed on the UBM patterns 160 by ball placement process or reflow process. In some embodiments, the redistribution layer 150 is located between the conductive elements 170 and the die 130.

Figure 8:
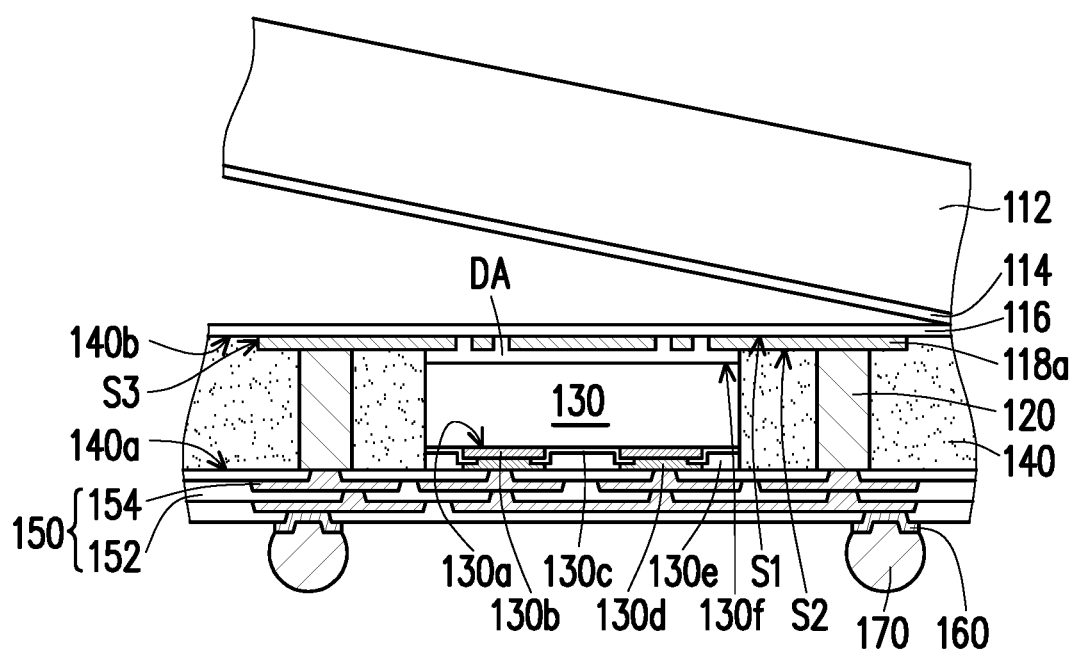

Referring to FIG. 8, in some embodiments, the carrier 112 is flipped (turned upside down) and then debonded from the buffer layer 116. The buffer layer 116 is easily separated from the carrier 112 due to the debond layer 114, and the buffer layer 116 are exposed. In some embodiments, the carrier 112 is detached from the buffer layer 116 through a debonding process and the carrier 112 and the debond layer 114 are removed. In some embodiments, the buffer layer 116 remained on the conductive plate 118*a* serves as a protection layer. Alternatively, in some embodiments, the buffer layer 116 may be subsequently removed.

Figure 9:
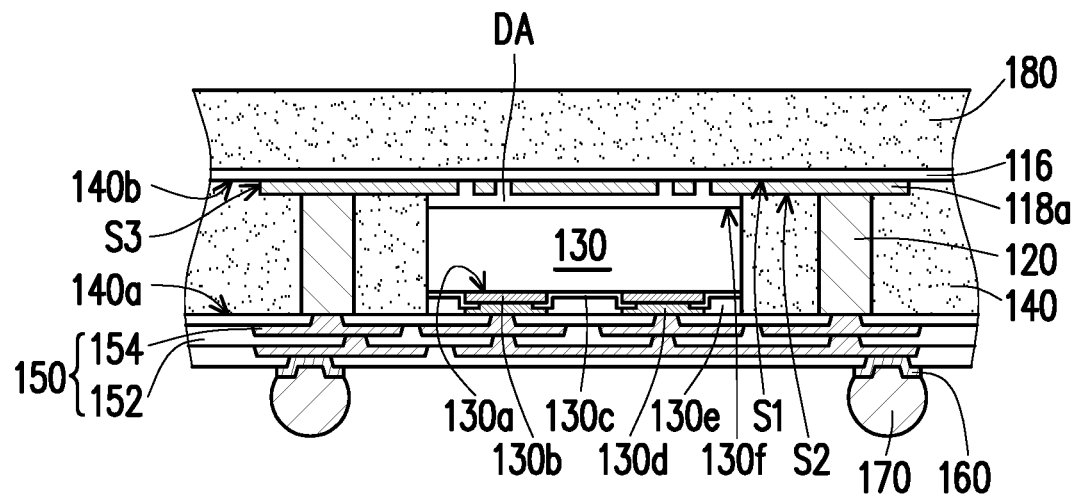

Referring to FIG. 9, in some embodiments, an encapsulant 180 is formed on the buffer layer 116 and over the conductive plate 118*a*, where the encapsulant 180 covers the buffer layer 116. In some embodiments, the buffer layer 116 is sandwiched between the encapsulant 180 and the first surface S1 of the conductive plate 118*a*. As shown in FIG. 9, the encapsulant 180 is formed on a surface of the buffer layer 116 where is facing away from the first surface S1 of the conductive plate 118*a*. In some embodiments, prior to forming the encapsulant 180, the conducive elements 170 may be, for example, transferred to a temporary carrier (not shown, such as a tape, etc.) for steadily holding the conductive elements 170 to avoid any damages to the conductive elements due to subsequent process(es). In an alternative embodiment, prior to forming the encapsulant 180, the buffer layer 116 may be optionally removed. In some embodiments, the encapsulant 180 includes, for example, epoxy resins or any other suitable type of molding materials. In some embodiments, the material of the encapsulant 180 has low permittivity (Dk) and low loss tangent (DO properties. Depending on the frequency range of the high-speed applications, suitable materials of the encapsulant may be selected based on the required electrical properties of the package. In some embodiments, the material of the encapsulant 180 can be the same as the material of the molding compound 140. In an alternative embodiment, the material of the encapsulant 180 can be different from the material of the molding compound 140, the disclosure is not limited thereto.

Figure 10:
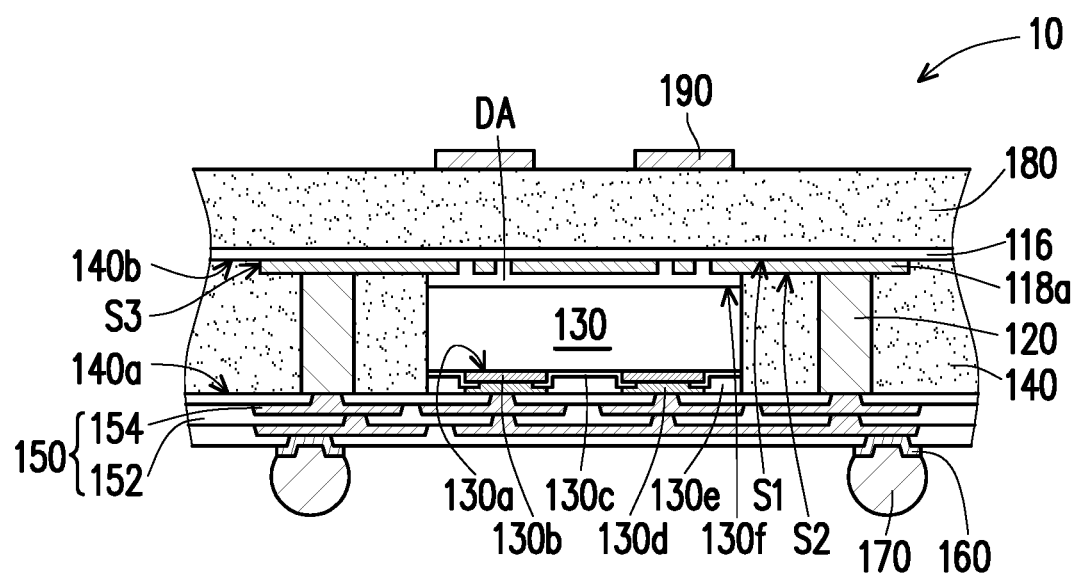
Figure 11:
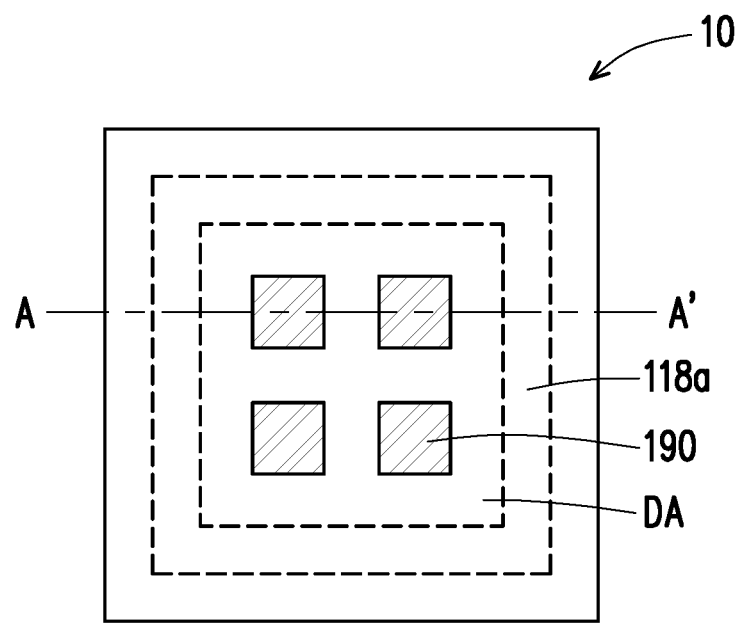
FIG. 11 is a schematic top view illustrating a relative position between a conductive plate, a die attach film, and antenna elements of a package structure according to some exemplary embodiments of the present disclosure.

Referring to FIG. 10, in some embodiments, antenna elements 190 are formed on formed on the encapsulant 180, and over the buffer layer 116 and the conductive plate 118a. The encapsulant 180 is located between the antenna elements 190 and the buffer layer 116. As shown in FIG. 10, the antenna elements 190 are formed on a surface of the encapsulant 180 facing away from the first surface S1 of the conductive plate 118a. In some embodiments, the antenna elements 190 are electrically coupled with the conductive plate 118a, where the conductive plate 118a overlapped with the antenna elements 190 serves as a ground plate and a feed-line for the antenna elements 190. In some embodiment, the conductive plate 118a is referred as a ground plate. Due to the configuration of the conductive plate 118a (i.e., the ground plate/the feed-line) and the antenna elements 190, less redistribution layer may be formed for the antenna application, such that an overall thickness of the package structure can be reduced. In some embodiments, the antenna elements 190 are formed by forming a metallization layer (not shown) by electroplating or deposition over the encapsulant 180 and then patterning the metallization layer by photolithographic and etching processes. In an alternative embodiment, the antenna elements 190 are formed by forming a metallization layer (not shown) by plating process. In some embodiments, the material of the first metallization layer includes aluminum, titanium, copper, nickel, tungsten, and/or alloys thereof. In some embodiments, the antenna elements 190 are arranged in form of a matrix, such as the N×N array or N×M arrays (N, M>0, N may or may not be equal to M). In some embodiment, the antenna elements 190 may include patch antennas.

As shown in FIG. 10 and FIG. 11, in some embodiments, the package structure 10 includes the antenna elements 190 arranged in form of an array, such as a 2×2 array, however, the disclosure is not limited thereto. The size of the array for antenna elements 190 can be designated and selected based on the demand. In some embodiments, the antenna elements 190 are located on and overlapped with the conductive plate 118a, the connecting film DA, and the die 130. In some embodiments, a dicing process is performed to cut the wafer having a plurality of package structures 10 into individual and separated package structures 10. In one embodiment, the dicing process is a wafer dicing process including mechanical blade sawing or laser cutting. Up to here, the manufacture of the package structure 10 is completed.

Referring to FIG. 10, in some embodiments, the package structure 10 includes the conductive plate 118a, the TIVs 120, the connecting film DA, the die 130, the molding compound 140, the redistribution layer 150, the conductive elements 170, the encapsulant 180, and the antenna elements 190. In some embodiments, the package structure 10 further includes the buffer layer 116 and the UBM patterns 160. In some embodiments, the die 130 is located on the second surface S2 of the conductive plate 118a through the connecting film DA. The connecting film DA is directly located between the die 130 and the conductive plate 118a, where the connecting film DA physically contacts the die 130, the second surface S2 of the conductive plate 118a, and the molding compound 140. Owing to the connecting film DA, the conductive plate 118a and the die 130 are thermally coupled, such that the heat generated by the die 130 may be dissipated through the conductive plate 118a, so that the conductive plate 118 functions as a thermal plate. In one embodiment, the conductive plate 118a is located on the buffer layer 116, where the buffer layer 116 may function as a protection layer for the conductive plate 118a. The conductive plate 118a is located between the buffer layer 116 and the connecting film DA, where the first surface S1 of the conductive plate 118a contacts the buffer layer 116, and the second surface S2 of the conductive plate 118a contacts the connecting film DA. In certain embodiments, the TIVs 120 are arranged aside and around the die 130, where at least one of the TIVs 120 are located on and physically contacts the conductive plate 118a. In some embodiments, the conductive plate 118a, the connecting film DA, the TIVs 120 and the die 130 are molded in the molding compound 140. As shown in FIG. 10, the second surface S2 and the sidewall S3 of the conductive plate 118a are covered by the molding compound 140, where the first surface S1 of the conductive plate 118a is exposed by the bottom surface 140b of the molding compound 140. The first surface S1 of the conductive plate 118a and the bottom surface 140b of the molding compound 140 are leveled and coplanar with each other. The sidewalls of the connecting film DA, the TIVs 120 and the die 130 are covered by the molding compound 140, where the top surfaces of the TIVs 120 and the die 130 are leveled with and coplanar to the top surface 140a of the molding compound 140.

As shown in FIG. 10, the redistribution layer 150 is located on the TIVs 120, the die 130, and the molding compound 140, where the redistribution layer 150 is electrically connected to the TIVs 120 and the die 130. The redistribution layer 150 is located on the top surface 140a of the molding compound 140, and the molding compound 140 is located between the redistribution layer 150 and the conductive plate 118a and between the redistribution layer 150 and the buffer layer 116. In certain embodiments, the conductive elements 170 are located on and electrically connected to redistribution layer 150, where the redistribution layer 150 is located between the TIVs 120 and the conductive elements 170, between the die 130 and the conductive elements 170, and between the molding compound 140 and the conductive elements 170. In one embodiment, the UBM patterns 160 are located between the redistribution layer 150 and the conductive elements 170.

Continued on FIG. 10, the antenna elements 190 and the encapsulant 180 are located on the buffer layer 116 and over the conductive plates 118a, where both the antenna elements 190 and the encapsulant 180 are located on a surface of the buffer layer 116 facing away from the first surface S1 of the conductive plate 118a. The encapsulant 180 is located between the antenna elements 190 and the buffer layer 116 and between the antenna elements 190 and the conductive plate 118a. In some embodiments, the antenna elements 190 are electrically coupled with the conductive plate 118a, where the conductive plate 118a serves as a feed-line for the antenna elements 190. The conductive plate 118a and the antenna elements 190 work together for antenna applications, and the conductive plate 118a is referred as the ground plate. Due to the configuration of the conductive plate 118a (the ground plate/the feed-line) and the antenna elements 190, less redistribution layer may be formed for the antenna application, such that an overall thickness of the package structure can be reduced. In one embodiment, some of the conductive elements 170 are electrically connected to the die 130 through the UBM patterns 160 and the redistribution layer 150. In one embodiment, some of the conductive elements 170 are electrically connected to the TIVs 120 through the redistribution layer 150. In one embodiment, some of the conductive elements 170 are electrically connected to the conductive plate 118a through the redistribution layer 150 and at least one of the TIVs 120. As shown in FIG. 10, an area of the conductive plate 118a is greater than an area of the die 130 in a vertical projection on the connecting film DA, where the vertical projection is projected along a direction perpendicular to a stacking direction of the die 130, the connecting film DA and the conductive plate 118a. In alternative embodiments, the area of the conductive plate 118a may be less than or equal to the area of the die 130 in the vertical projection on the connecting film DA.

Figure 13:
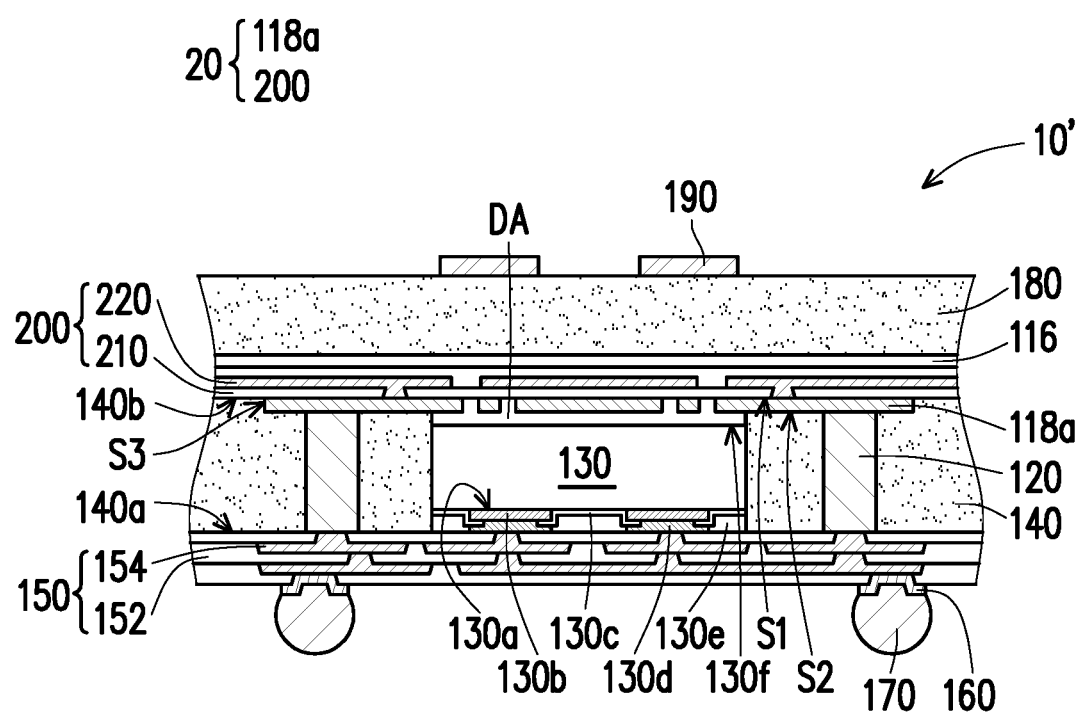
FIG. 13 is a schematic cross sectional view of a package structure according to some exemplary embodiments of the present disclosure.

FIG. 13 is a schematic cross sectional view of a package structure according to some exemplary embodiments of the present disclosure. Referring to FIG. 10 and FIG. 13 together, the package structure 10 depicted in FIG. 10 and the package structure 10' depicted in FIG. 13 is similar, the difference is that, for the package structure 10' depicted in FIG. 13, an additional element, a redistribution layer 200, is further disposed on the conductive plate 118a. The elements similar to or substantially the same as the elements described above will use the same reference numbers, and certain details or descriptions of the same elements will not be repeated herein.

As shown in FIG. 13, the redistribution layer 200 includes sequentially forming one or more polymer dielectric layers 210 and one or more metallization layers 220 in alternation. In certain embodiments, as shown in FIG. 13, the redistribution layer 200 is directly located between the buffer layer 116 and the first surface S1 of the conductive layer 118a. The metallization layer 220 are sandwiched between the polymer dielectric layers 210, and a bottom surface of the metallization layer 220 is exposed by the lowest layer of the polymer dielectric layers 210 to connect the first surface S1 of the conductive plate 118a. Owing to such positioning configuration of the redistribution layer 200 and the conductive plate 118a together constitute a redistribution structure 20, where the redistribution structure 20 has a multi-layer structure and serves a ground plate and a feed-line of the antenna elements 190. In some embodiments, the redistribution structure 20 (including the redistribution layer 200 and the conductive plate 118a) is patterned to form a predetermined target pattern having a top view illustrated in FIG. 12A to FIG. 12G for electrical connection or antenna applications, the disclosure is not limited thereto. In addition, it should be noted that the redistribution layer 200 is not limited to include two dielectric layers and/or one metallization layers. In some embodiments, the materials and formation methods of the redistribution layer 200 and the redistribution layer 150 can be substantially the same or different, the disclosure is not limited thereto.

According to some embodiments, a package structure includes a conductive plate, a semiconductor die, a molding compound, and antenna elements. The conductive plate has a first surface, a second surface and a sidewall connecting the first surface and the second surface. The semiconductor die is located on the second surface of the conductive plate. The molding compound laterally encapsulates the semiconductor die and covers the sidewall and a portion of the second surface exposed by the semiconductor die, wherein the first surface of the conductive plate is coplanar with a surface of the molding compound. The antenna elements are located over the first surface of the conductive plate.

According to some embodiments, a package structure includes at least one semiconductor die, a connecting film, a conductive plate, a molding compound, a first redistribution circuit structure, an encapsulant, and antenna elements. The at least one semiconductor die has a front surface and a rear surface opposite to the front surface. The connecting film is located on the rear surface. The conductive plate is located on the connecting film. The molding compound encapsulates the at least one semiconductor die and the connecting film, wherein a first surface of the molding compound is coplanar with the front surface of the at least one semiconductor die, and a second surface of the molding compound is coplanar with a third surface of the conductive plate, wherein along a stacking direction of the at least one semiconductor die, the connecting film and the conductive plate, the first surface is opposite to the second surface, the third surface is opposite to a fourth surface, and the fourth surface is closer to the at least one semiconductor die than the third surface is. The first redistribution circuit structure is located on the first surface of the molding compound. The encapsulant is located on the third surface of the conductive plate. The antenna elements are located on the encapsulation, wherein the encapsulation is located between the antenna elements and the third surface of the conductive plate.

According to some embodiments, a manufacturing method of a package structure is provided with the following steps, forming a conductive plate having a first surface, a second surface and a sidewall connecting the first surface and the second surface; disposing a semiconductor die on the second surface of the conductive plate; laterally encapsulating the semiconductor die in a molding compound, the sidewall and a portion of the second surface exposed by the semiconductor die being covered by the molding compound, and the first surface being coplanar to a surface of the molding compound; and forming antenna elements over the first surface of the conductive plate, the conductive plate is located between the semiconductor die and the conductive plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
a conductive plate, having a first surface, a second surface and a sidewall connecting the first surface and the second surface;
a semiconductor die, located on the second surface of the conductive plate;

a molding compound, laterally encapsulating the semiconductor die and covering the sidewall and a portion of the second surface of the conductive plate exposed by the semiconductor die;
antenna elements, located over the first surface of the conductive plate; and
an encapsulant, located between the conductive plate and the antenna elements, wherein along a stacking direction of the semiconductor die and the conductive plate, a distance between the encapsulant and the conductive plate is substantially equal to a distance between the encapsulant and the molding compound.

2. The package structure of claim 1, further comprising:
through interlayer vias, located on the second surface of the conductive plate and molded in the molding compound;
a first redistribution circuit structure, located on the second surface of the conductive plate and the molding compound, wherein the semiconductor die and the through interlayer vias are located between the conductive plate and the first redistribution circuit structure; and
conductive elements, located on the first redistribution circuit structure, wherein the first redistribution circuit structure is located between the conductive elements and the molding compound.

3. The package structure of claim 1, further comprising:
a connecting film, located between the semiconductor die and the conductive plate, wherein a sidewall of the connecting film extending from the semiconductor die to the conductive plate is covered by the molding compound, and the connecting film is made of a thermally conductive and electrically conductive material or is made of a thermally conductive and electrically isolated material.

4. The package structure of claim 1, further comprising:
a second redistribution circuit structure, located on the first surface of the conductive plate, wherein the second redistribution circuit structure is located between the antenna elements and the conductive plate.

5. The package structure of claim 1, wherein the conductive plate comprises a conductive plate having a predetermined target pattern.

6. The package structure of claim 1, wherein the conductive plate comprises a solid metal plate having first openings and a plurality of metal lines, wherein the solid metal plate is separated from each of the plurality of metal lines through second openings.

7. The package structure of claim 1, wherein the conductive plate comprises a plurality of metal lines.

8. The package structure of claim 1, wherein the conductive plate comprises a solid metal plate or a solid metal plate having slits arranged in a cross-form.

9. The package structure of claim 1, wherein the conductive plate comprises a plurality of metal blocks interconnected with a plurality of metal strips.

10. A package structure, comprising:
at least one semiconductor die, having a front surface and a rear surface opposite to the front surface;
a connecting film, located on the rear surface;
a conductive plate, located on the connecting film;
a molding compound, encapsulating the at least one semiconductor die and the connecting film, wherein a first surface of the molding compound is coplanar with the front surface of the at least one semiconductor die, and a second surface of the molding compound is coplanar with a third surface of the conductive plate, wherein along a stacking direction of the at least one semiconductor die, the connecting film and the conductive plate, the first surface is opposite to the second surface, the third surface is opposite to a fourth surface of the conductive plate, and the fourth surface is closer to the at least one semiconductor die than the third surface is;
a first redistribution circuit structure; located on the first surface of the molding compound; and
a second redistribution circuit structure, located on the second surface of the molding compound, wherein the at least one semiconductor die is located between and electrically coupled to the second redistribution circuit structure and the first redistribution circuit structure.

11. The package structure of claim 10, further comprising:
through interlayer vias, located on the conductive plate and molded in the molding compound; and
conductive elements, located on the first redistribution circuit structure, wherein the first redistribution circuit structure is located between the conductive elements and the molding compound.

12. The package structure of claim 11, wherein the conductive plate further comprises a sidewall connecting the third surface and the fourth surface, and the fourth surface and the sidewall of the conductive plate, sidewalls of the through interlayer vias, and a sidewall of the connecting film are covered by the molding compound.

13. The package structure of claim 10, further comprising:
an encapsulant, located over the third surface of the conductive plate; and
antenna elements, located on the encapsulant, wherein the encapsulant is located between the antenna elements and the third surface of the conductive plate.

14. The package structure of claim 10, wherein the conductive plate comprises a conductive plate having a predetermined target pattern.

15. A method of manufacturing a package structure, comprising:
forming a conductive plate having a first surface, a second surface and a sidewall connecting the first surface and the second surface;
disposing a semiconductor die on the second surface of the conductive plate;
laterally encapsulating the semiconductor die in a molding compound, the sidewall and a portion of the second surface of the conductive plate exposed by the semiconductor die being covered by the molding compound;
disposing an encapsulant over the first surface of the conductive plate; and
forming antenna elements over the first surface of the conductive plate, the encapsulant being located between the conductive plate and the antenna elements, wherein along a stacking direction of the semiconductor die and the conductive plate, a distance between the encapsulant and the conductive plate is substantially equal to a distance between the encapsulant and the molding compound.

16. The method of claim 15, wherein forming the conductive plate further comprises patterning the conductive plate to form a predetermined target pattern therein.

17. The method of claim 15, wherein forming the antenna elements comprises:
forming, on the encapsulant, a plurality of patch antennas arranged in form of a matrix.

18. The method of claim 15, prior to laterally encapsulating the semiconductor die in the molding compound, further comprising:
   disposing through interlayer vias on the second surface of the conductive plate,
   wherein laterally encapsulating the semiconductor die in the molding compound further comprises molding the through interlayer vias in the molding compound.

19. The method of claim 15, after laterally encapsulating the semiconductor die in the molding compound and prior to forming the antenna elements, further comprising:
   forming a first redistribution circuit structure on the molding compound and the semiconductor die exposed by the molding compound, wherein the semiconductor die is located between the conductive plate and the first redistribution circuit structure; and
   disposing conductive elements on the first redistribution circuit structure, wherein the first redistribution circuit structure is located between the conductive elements and the molding compound.

20. The method of claim 19, prior to forming the conductive plate, further comprising:
   forming a second redistribution circuit structure, wherein forming the conductive plate comprises forming the conductive plate on the second redistribution circuit structure, and the first surface of the conductive plate is in contact with the second redistribution circuit structure.

* * * * *